(12) United States Patent
Allen

(10) Patent No.: US 8,181,534 B2
(45) Date of Patent: May 22, 2012

(54) ULTRASONIC FLOW METER WITH TRANSDUCER ASSEMBLY, AND METHOD OF MANUFACTURING THE SAME WHILE MAINTAINING THE RADIAL POSITION OF THE PIEZOELECTRIC ELEMENT

(75) Inventor: Charles R. Allen, Houston, TX (US)

(73) Assignee: Daniel Measurement and Control, Inc., Houston, TX (US)

( * ) Notice: Subject to any disclaimer, the term of this patent is extended or adjusted under 35 U.S.C. 154(b) by 325 days.

(21) Appl. No.: 12/683,044

(22) Filed: Jan. 6, 2010

(65) Prior Publication Data

US 2011/0162461 A1    Jul. 7, 2011

(51) Int. Cl.
*G01F 1/20* (2006.01)
*G01F 1/66* (2006.01)
*H01L 41/22* (2006.01)
(52) U.S. Cl. .................. 73/861.18; 73/861.27; 29/25.35
(58) Field of Classification Search ................. None
See application file for complete search history.

(56) References Cited

U.S. PATENT DOCUMENTS

| | | | |
|---|---|---|---|
| 5,437,194 A | 8/1995 | Lynnworth | |
| 5,876,344 A * | 3/1999 | Baker et al. | 600/463 |
| 7,397,168 B2 | 7/2008 | Straub, Jr. et al. | |
| 7,628,081 B1 | 12/2009 | Feller | |
| 2011/0162460 A1* | 7/2011 | Allen et al. | 73/861.18 |
| 2011/0162461 A1* | 7/2011 | Allen | 73/861.18 |
| 2011/0162462 A1* | 7/2011 | Allen | 73/861.18 |

OTHER PUBLICATIONS

International Application No. PCT/US2011/020109 Search Report and Written Opinion dated Aug. 19, 2011.

* cited by examiner

*Primary Examiner* — Harshad Patel
(74) *Attorney, Agent, or Firm* — Conley Rose, P.C.

(57) ABSTRACT

A transducer assembly for an ultrasonic flow meter comprises a piezoelectric capsule. In an embodiment, the piezoelectric capsule includes a housing having a central axis, a first end, a second end opposite the first end, and a first inner chamber extending axially from the first end. In addition, the piezoelectric capsule includes a piezoelectric element disposed in the first inner chamber. Further, the piezoelectric element includes a plurality of spacers disposed in the first inner chamber between the piezoelectric element and the housing.

28 Claims, 10 Drawing Sheets

ULTRASONIC FLOW METER WITH TRANSDUCER ASSEMBLY, AND METHOD OF MANUFACTURING THE SAME WHILE MAINTAINING THE RADIAL POSITION OF THE PIEZOELECTRIC ELEMENT

CROSS-REFERENCE TO RELATED APPLICATIONS

Not applicable.

STATEMENT REGARDING FEDERALLY SPONSORED RESEARCH OR DEVELOPMENT

Not applicable.

BACKGROUND

The various embodiments relate to ultrasonic flow meters and, more particularly, to transducer assemblies employed in ultrasonic flow meters.

After hydrocarbons have been removed from the ground, the fluid stream (either in a liquid phase or a gaseous phase) is transported from place to place via pipelines. It is desirable to know with accuracy the amount of fluid flowing in the stream, and particular accuracy is demanded when the fluid is changing hands, or during "custody transfer." Even where custody transfer is not taking place, however, measurement accuracy is desirable, and in these situations ultrasonic flow meters may be used.

An ultrasonic flow meter includes two or more transducer assemblies, each secured inside of a port in the body, or spool piece, of the flow meter. To contain the transported fluid within the flow meter, an end connector is secured over the exterior end of each transducer port in the spool piece. Thus, the spool piece and end connectors create a pressure boundary that contains fluid flowing through the meter.

To measure fluid flow through the meter, a first and a second transducer assembly is each positioned in a port in the spool piece, such that each transducer assembly faces the other. Each transducer assembly includes a piezoelectric element. When an alternating current is applied to the piezoelectric element of the first transducer assembly, the piezoelectric element responds by radiating an ultrasonic wave in the fluid being transported through the flow meter. When the wave is incident upon the piezoelectric element of the second transducer assembly, the second transducer assembly responds by generating an electric signal. Some time later, an alternating current is applied to the piezoelectric element of the second transducer assembly, and the piezoelectric element responds by radiating an ultrasonic wave through the fluid in the flow meter. When the wave is incident upon the piezoelectric element of the first transducer assembly, the first transducer assembly responds by generating an electric signal. In this way, the transducer assemblies transmit and receive signals back-and-forth across the fluid stream.

Each transducer assembly is connected to a cable that extends through the end connector to a location external to the spool piece, such as an electronics base enclosure typically mounted to the exterior of the spool piece. The cable carries the signals created by the piezoelectric elements to an acquisition board positioned within the electronics base enclosure, where the signal may be processed and subsequently used to determine the fluid flow rate through the meter.

In most conventional transducer assemblies, the piezoelectric element is positioned in one end of the transducer assembly proximal the fluid stream flowing through the spool piece.

Typically, the piezoelectric element is positioned in a housing and surrounded by a matching layer that provides acoustical coupling between the piezoelectric element and fluid flowing through the spool piece. To optimize the quality of the ultrasonic signal (e.g., larger amplitude and faster rise time), the piezoelectric element is radially centered in the housing and the thickness of the matching layer between the piezoelectric element and the end of the transducer assembly in the fluid flow is carefully controlled. Specifically, radially centering the piezoelectric element insures that the ultrasonic wave is symmetrical about the transducer center which improves flow measurement accuracy because dimensional measurements of the port position in the meter bore typically assumes that the ultrasonic wave is in the center of the port hole. Further, radially centering the piezoelectric element eliminates concerns with the rotational orientation of the transducer in the port.

To properly position the piezoelectric element during manufacture of the transducer assembly, the piezoelectric element is typically positioned and held at the desired in the housing with a positioning tool. While holding the piezoelectric element at the desired location within the housing with the positioning tool, a first matching layer fill is disposed in the housing around a portion of the piezoelectric element. Without interfering with the matching layer, the positioning tool continues to hold the piezoelectric element in the desired position as the first matching layer fill solidifies and cures. Once the first matching layer fill has sufficiently hardened, it helps hold the piezoelectric element in place, and thus, the positioning tool may be removed before a second matching layer fill is disposed in the housing around the remainder of the piezoelectric element. Thus, during the manufacture of many conventional transducer assemblies, the proper positioning of the piezoelectric element within the housing is achieved with a specialized positioning tool, and further, a relatively labor intensive and time consuming two separate matching layer fill process is employed.

Accordingly, there remains a need in the art for transducer assemblies having piezoelectric elements properly positioned to optimize the quality of the ultrasonic signals. Such transducer assemblies would be particularly well received if their manufacture was relatively simple, low cost, and less time consuming.

SUMMARY

These and other needs in the art are addressed in one embodiment by a transducer assembly for an ultrasonic flow meter. In an embodiment, the transducer assembly comprises a piezoelectric capsule. In an embodiment, the piezoelectric capsule includes a housing having a central axis, a first end, a second end opposite the first end, and a first inner chamber extending axially from the first end. In addition, the piezoelectric capsule includes a piezoelectric element disposed in the first inner chamber. Further, the piezoelectric element includes a plurality of spacers disposed in the first inner chamber between the piezoelectric element and the housing.

These and other needs in the art are addressed in another embodiment by an ultrasonic flow meter for measuring the flow of a fluid through a pipeline. In an embodiment, the ultrasonic flow meter comprises a spool piece including a throughbore and a transducer port extending from the outer surface of the spool piece to the throughbore. In addition, the ultrasonic flow meter comprises a transducer assembly disposed in the transducer port. The transducer assembly has a central axis and comprises a piezoelectric capsule. The piezoelectric capsule includes a housing having a first end, a second end, and an inner chamber proximal the first end. In addition, the piezoelectric capsule includes a piezoelectric element disposed in the inner chamber. Further, the piezoelectric capsule includes a plurality of spacers disposed within the inner chamber between the piezoelectric element and the housing. Moreover, the ultrasonic flow meter comprises a transformer capsule including a transformer, wherein the transformer capsule is coupled to the piezoelectric capsule.

These and other needs in the art are addressed in another embodiment by a method for manufacturing an ultrasonic flow meter. In an embodiment, the method comprises providing a piezoelectric housing having a central axis, a first end, a second end opposite the first end, and a first counterbore extending axially from the first end. In addition, the method comprises inserting a piezoelectric element into the first counterbore. Further, the method comprises inserting a plurality of spacers into the first counterbore. Still further, the method comprises positioning each of the spacers radially between the piezoelectric element and the housing. Moreover, the method comprises filling the first counterbore with a matching layer after positioning each of the spacers.

Thus, embodiments described herein comprise a combination of features and advantages intended to address various shortcomings associated with certain prior devices, systems, and methods. The various characteristics described above, as well as other features, will be readily apparent to those skilled in the art upon reading the following detailed description, and by referring to the accompanying drawings.

BRIEF DESCRIPTION OF THE DRAWINGS

For a detailed description of exemplary embodiments of the invention, reference will now be made to the accompanying drawings in which.

DETAILED DESCRIPTION

Figure 1A:
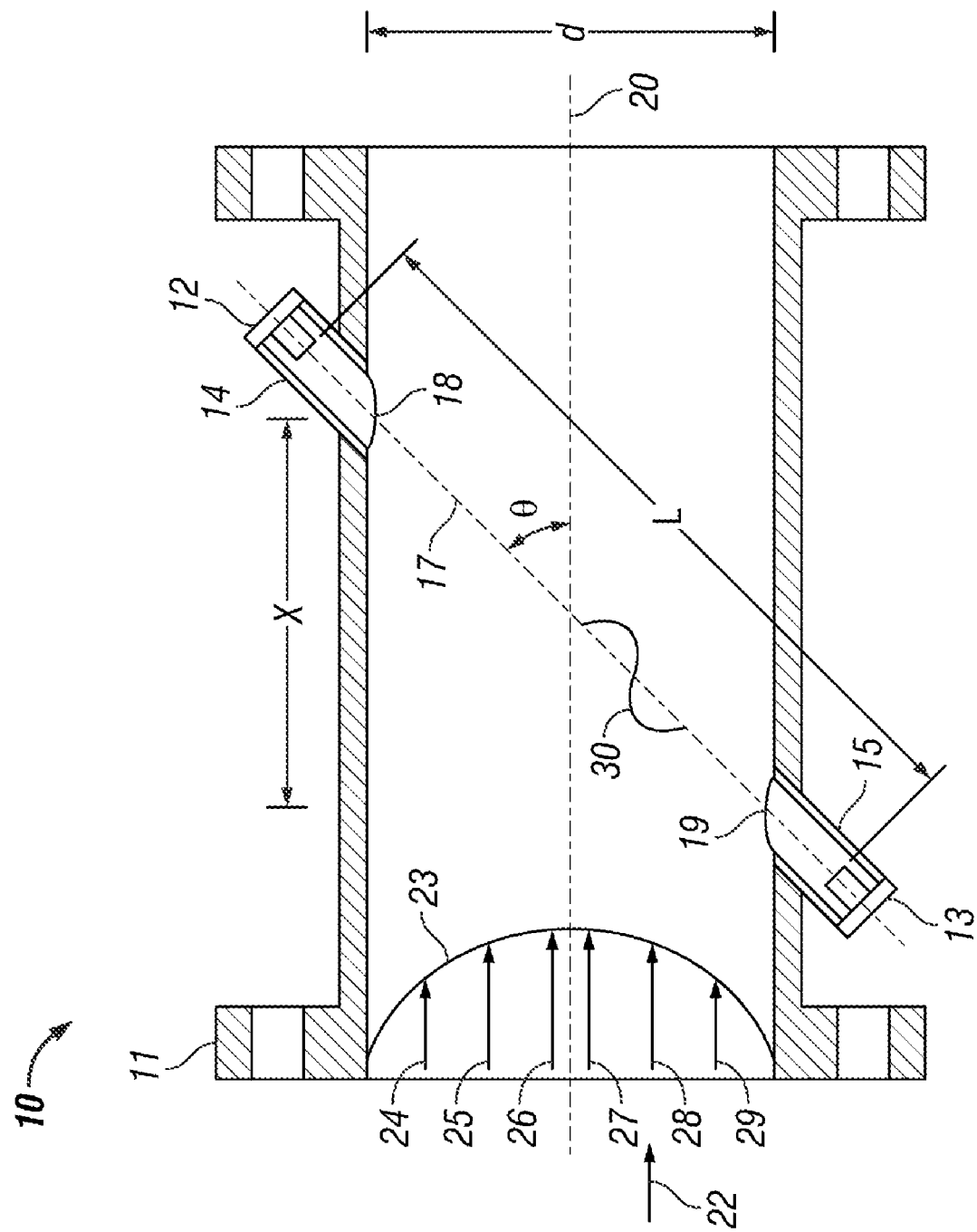
FIG. 1A is a cross-sectional top view of an embodiment of an ultrasonic flow meter.

The following discussion is directed to various embodiments of the invention. Although one or more of these embodiments may be presently preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Certain terms are used throughout the following description and claims to refer to particular features or components. As one skilled in the art will appreciate, different persons may refer to the same feature or component by different names. This document does not intend to distinguish between components or features that differ in name but not function. The drawing figures are not necessarily to scale. Certain features and components herein may be shown exaggerated in scale or in somewhat schematic form and some details of conventional elements may not be shown in interest of clarity and conciseness.

In the following discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection, or through an indirect connection via other devices, components, and connections. In addition, as used herein, the terms "axial" and "axially" generally mean along or parallel to a central axis (e.g., central axis of a body or a port), while the terms "radial" and "radially" generally mean perpendicular to the central axis. For instance, an axial distance refers to a distance measured along or parallel to the central axis, and a radial distance means a distance measured perpendicular to the central axis.

Figure 1B:
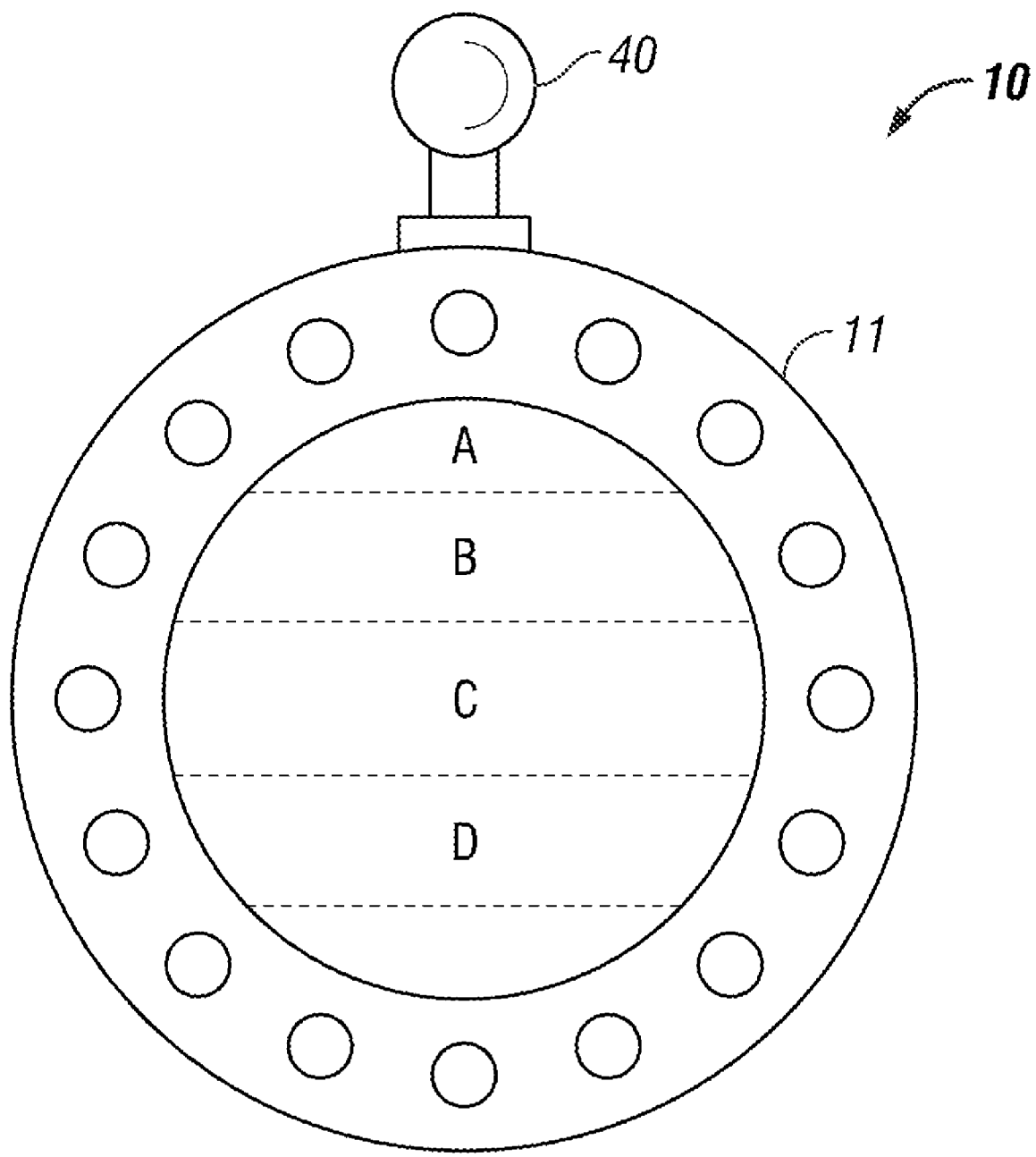
FIG. 1B is a schematic end view of the flow meter of FIG. 1A.

FIGS. 1A and 1B show an embodiment of an ultrasonic flow meter 10 for purposes of explaining its various components and their relationships. Spool piece 11 is suitable for placement between sections of a pipeline. Spool piece 11 has a predetermined size and defines a central passage through which a fluid (e.g., gas and/or liquid) flows. An illustrative pair of transducers 12 and 13 and their respective housings 14 and 15 are located along the length of spool piece 11. Transducers 12 and 13 are acoustic transceivers. More particularly, transducers 12, 13 are ultrasonic transceivers, meaning that they both generate and receive acoustic energy having frequencies of above about 20 kilohertz.

The acoustic energy may be generated and received by a piezoelectric element in each transducer 12, 13. To generate an acoustic signal, the piezoelectric element is stimulated electrically by way of a sinusoidal signal and responds by vibrating. The vibration of the piezoelectric element generates the acoustic signal that then travels through the fluid to the corresponding transducer 12, 13 of the transducer pair. Similarly, upon being struck by acoustic energy (i.e., the acoustic signal and other noise signals), the receiving piezoelectric element vibrates and generates a sinusoidal electrical signal that is detected, digitized, and analyzed by electronics associated with the meter.

A path 17, sometimes referred to as a "chord," exists between illustrative transducers 12, 13 at an angle θ to a centerline 20 of spool piece 11. The length of "chord" 17 is the distance between the face of transducer 12 and the face of transducer 13. Points 18 and 19 define the locations where acoustic signals generated by transducers 12, 13 enter and leave fluid flowing through the spool piece 11 (i.e., the entrance to the spool piece bore). The position of transducers 12, 13 may be defined by the angle θ, by a first length L measured between transducers 12, 13, a second length X corresponding to the axial distance between points 18, 19, and a third length d corresponding to the pipe inside diameter.

In most cases distances d, X, and L are precisely determined during meter fabrication. Further, transducers 12, 13 are usually placed a specific distance from points 18, 19, respectively, regardless of meter size (i.e., spool piece size). Fluid passing through spool piece 11, such as natural gas, flows in a direction 22 with a velocity profile 23. Velocity vectors 24-29 illustrate that the gas velocity through spool piece 11 increases toward the centerline 20.

Initially, downstream transducer 12 generates an acoustic signal that propagates across the fluid in the spool piece 11, and is then incident upon and detected by upstream transducer 13. A short time later (e.g., within a few milliseconds), the upstream transducer 13 generates a return acoustic signal that propagates back across the fluid in the spool piece 11, and is then incident upon and detected by the downstream transducer 12. Thus, the transducers 12, 13 play "pitch and catch" with signals 30 along chordal path 17. During operation, this sequence may occur thousands of times per minute.

The transit time of the acoustic signal 30 between transducers 12, 13 depends in part upon whether the acoustic signal 30 is traveling upstream or downstream with respect to the fluid flow. The transit time for an acoustic signal traveling downstream (i.e., in the same direction as the fluid flow) is less than its transit time when traveling upstream (i.e., against the fluid flow). The upstream and downstream transit times can be used to calculate the average velocity along the signal path, or chordal path 17, and the speed of sound in the measured fluid.

Ultrasonic flow meters can have one or more acoustic signal paths. FIG. 1B illustrates an elevation view of one end of ultrasonic flow meter 10. As shown, ultrasonic flow meter has four chordal paths A, B, C, D at varying levels within the spool piece 11. Each chordal path A-D extends between a pair of transducers, each transducer behaving alternately as a transmitter and receiver. Hidden from view in FIG. 1B are the four pairs of transducers that correspond to chordal paths A-D. A control electronics package or enclosure 40 is also shown. Electronics package 40 acquires and processes data for the four chordal paths A-D.

Figure 1C:
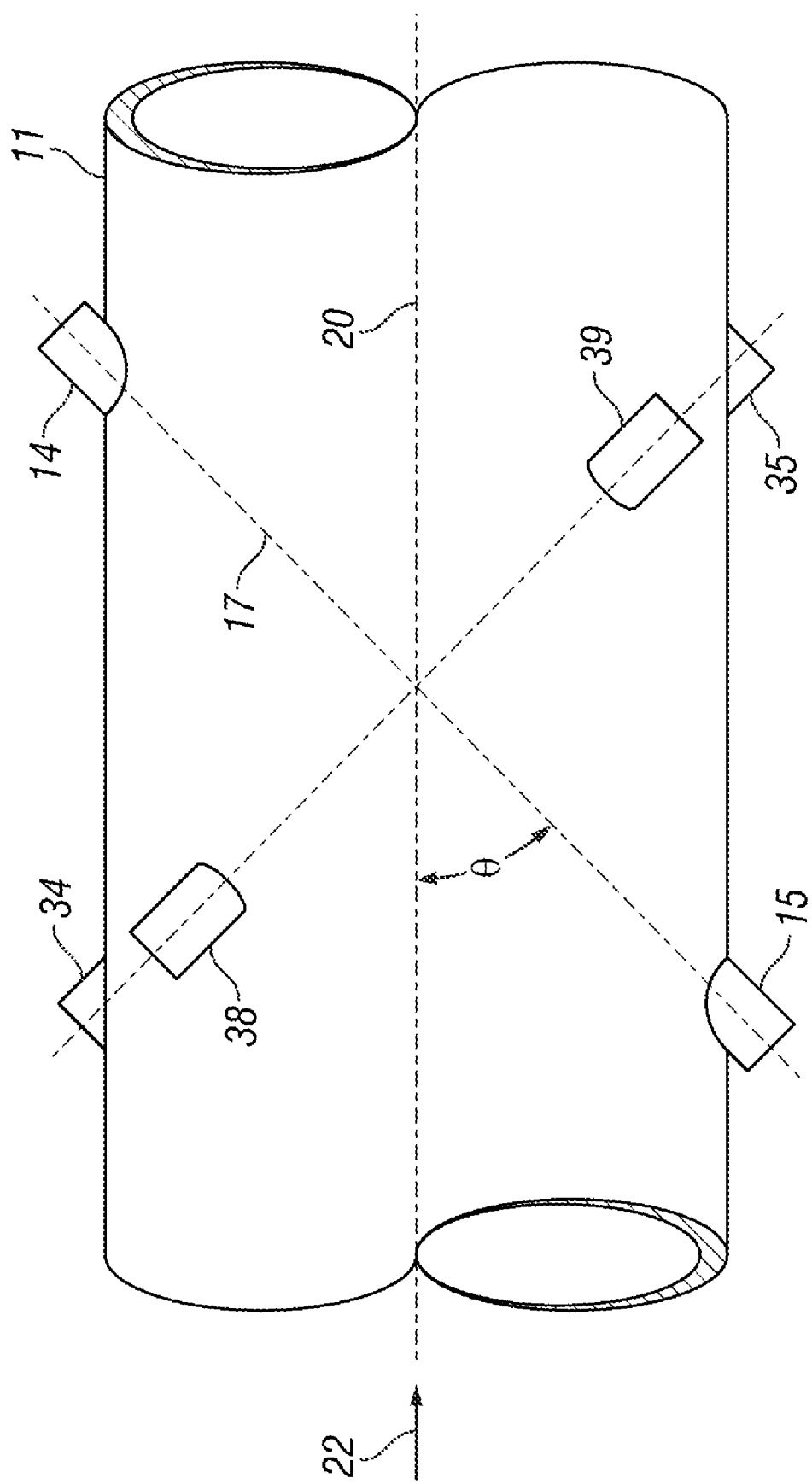
FIG. 1C is a schematic top view of the flow meter of FIG. 1A.

The arrangement of the four pairs of transducers may be more easily understood with reference to FIG. 1C. Four pairs of transducer housings are formed in spool piece 11. A transducer is mounted within each housing. A single chordal path extends between each pair of transducers. For example, a first pair of transducer housings 14, 15 house transducers 12, 13 (FIG. 1A). The transducers 12, 13 are mounted within transducer housings 14, 15, respectively, at a non-perpendicular angle θ to centerline 20 of spool piece 11. Chordal path 17 extends between transducers 12, 13. Another pair of transducer housings 34, 35 (only partially in view) and associated transducers is mounted such that a chordal path extending between the transducers in transducer housings 34, 35 and chordal path 17 between transducers 12, 13 loosely forms the shape of an "X."

Similarly, transducer ports 38, 39 are placed parallel to transducer ports 34, 35 but at a different "level" (i.e., a different radial position in spool piece 11). Not explicitly shown in FIG. 1C is a fourth pair of transducers and transducer ports. Taking FIGS. 1B and 1C together, the pairs of transducers are arranged such that the chords paths A, B of the upper two pairs of transducers form an the shape of an "X", and the chordal paths C, D of the lower two pairs of transducers correspondingly also form the shape of an "X." The flow velocity of the fluid may be determined at each chord A-D to obtain chordal flow velocities, and the chordal flow velocities then combined to determine an average flow velocity through spool piece 11.

From the average flow velocity, the amount of fluid flowing through the spool piece 11, and thus the pipeline, may be determined.

Figure 2:
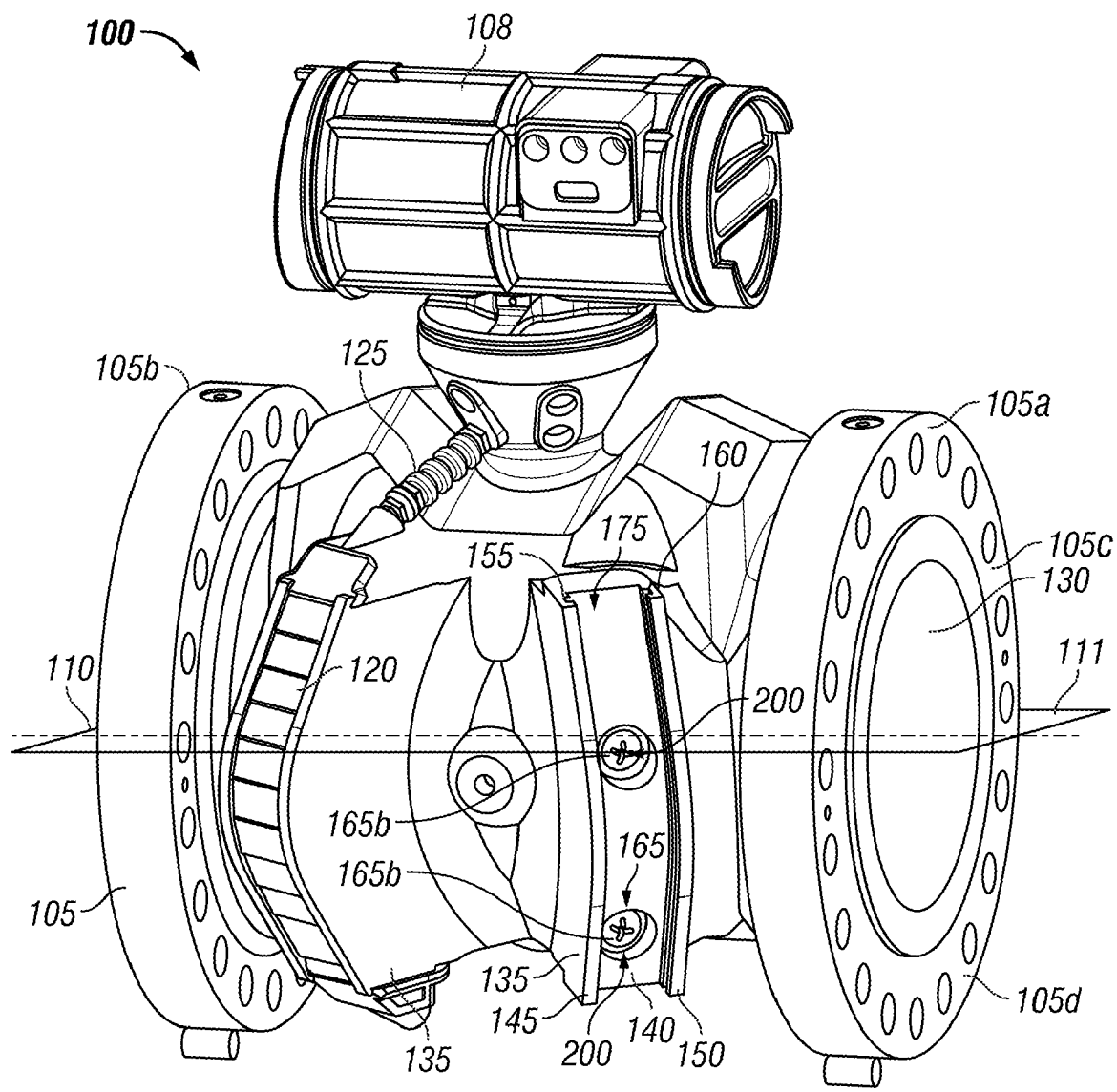
FIG. 2 is a perspective view of an embodiment of an ultrasonic flow meter.
Figure 3:
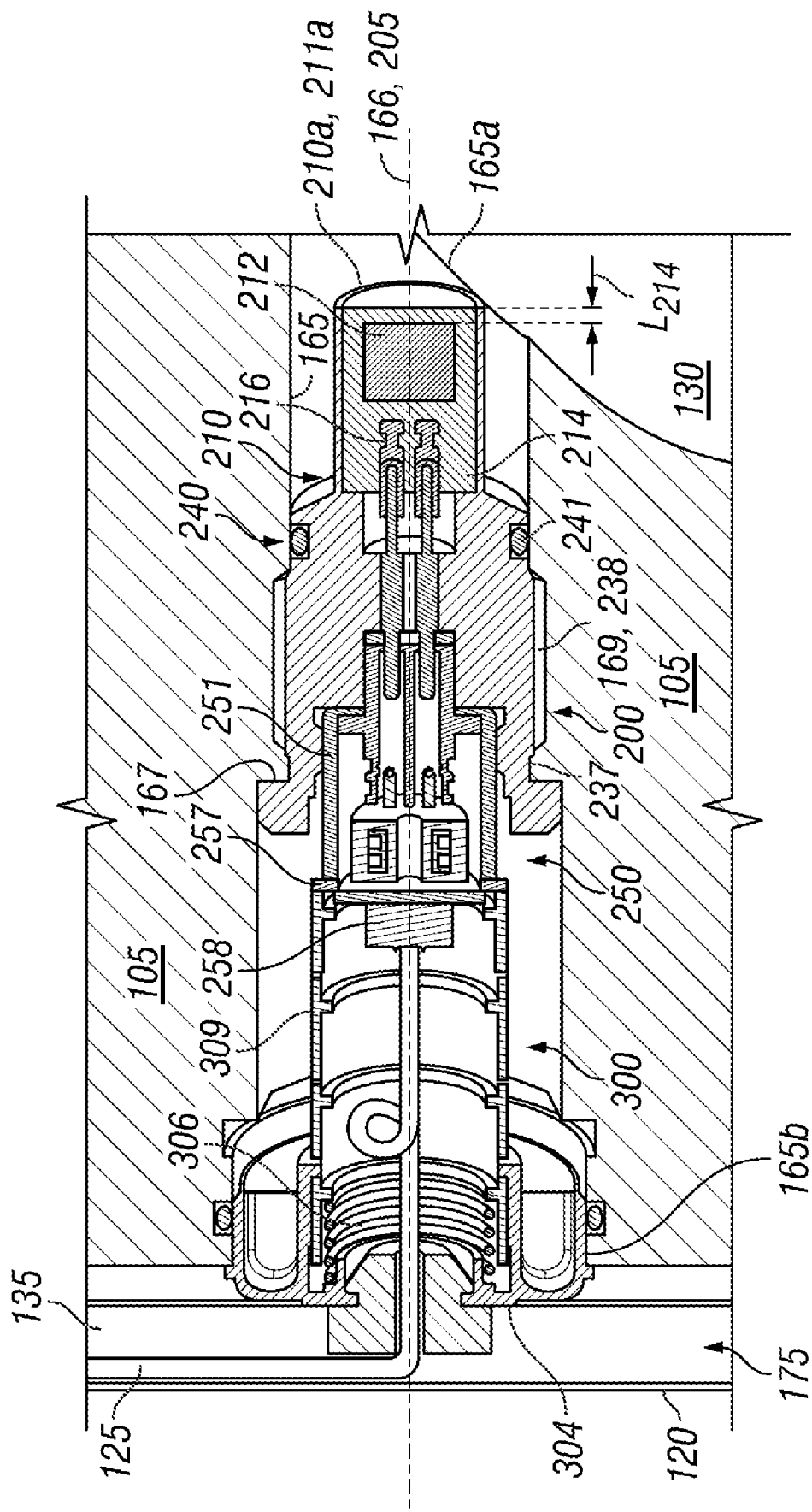
FIG. 3 is an enlarged partial cross-sectional side view of an embodiment of a transducer assembly in accordance with the principles described herein disposed in one of the transducer ports of the ultrasonic flow meter of FIG. 2.

Referring now to FIGS. 2 and 3, perspective and partial cross-sectional views, respectively, of an ultrasonic flow meter 100 for measuring fluid flow rates in a pipeline are shown. Ultrasonic flow meter 100 includes a body or spool piece 105, a plurality of gas ultrasonic transducer assemblies 200, an electrical wire or cable 125 extending from each transducer assembly 200 to an electronics package 108 coupled to the top of spool piece 105, and a removable cable cover 120.

Spool piece 105 is the housing for ultrasonic flow meter 100 and configured for placement between sections of a pipeline. Spool piece 105 has a central axis 110 and includes a first or inlet end 105a, a second end or outlet end 105b, a fluid flow passage or throughbore 130 extending between ends 105a, 105b, and a plurality of transducer ports 165 extending from the outer surface of spool piece 105 to throughbore 130. In this embodiment, ends 105a, b each include a flange that axially couples spool piece 105 end-to-end between individual pipe segments of a pipeline. A horizontal reference plane 111 passes through central axis 110 and generally divides spool piece 105 into upper and lower halves 105c, d, respectively.

As best shown in FIG. 2, spool piece 105 also includes a plurality of transducer cable bosses—extending generally vertically along its outer circumference. Each boss 135 is positioned such that it intersects the radially outer (relative to axis 110) ends 165b of two vertically spaced transducer ports 165. Each cable 125 extends from one of the transducer assemblies 200 installed one port 165 along one of the bosses 135 to the electronics package 108. As two transducer ports 165 intersect each boss 135, two cables 125 extend vertically within each boss 135.

Each transducer boss 135 further includes recessed face 140, sides 145, 150, and side grooves 155, 160. Face 140 and sides 145, 150 define a pocket 175 therebetween that receives cables 125. Side grooves 155, 160 extend along opposing surfaces of sides 145, 150, respectively, which also face pocket 175. With cables 125 disposed within pocket 175 of transducer boss 135, the lateral edges of cable cover 120 are inserted into and slidingly advanced within grooves 155, 160, thereby covering cables 125 and protecting them from the environment external to spool piece 105. Examples of suitable cable covers are disclosed in U.S. patent application Ser. No. 11/763,783, entitled "Cable Cover for an Ultrasonic Flow Meter" and filed on Jun. 15, 2007, which is hereby incorporated herein by reference in its entirety for all purposes.

In some embodiments, spool piece 105 is a casting into which transducer bosses 135 are machined. Pockets 175 are also created by the machining process to desired dimensions. The width of face 140 is greater than the diameter of transducer ports 165. The depth of pocket 175 is sufficient to allow side grooves 155, 160, to be machined into sides 145, 150 of transducer boss 135 as well as pocket 175 itself, and to receive cables 125. In some embodiments, side grooves 155, 160 are three-sided grooves with square corners. In other embodiments, side grooves 155, 160 may be half-dovetail grooves with only two sides, where the first side is parallel to face 140 of transducer boss 135 and the second side is oriented at angle less than 90 degrees from the first side. Moreover, in embodiments where side grooves 155, 160 are half-dovetail grooves, the angle of sides 145, 150 with respect to face 140 may be less than or greater than 90 degrees.

As best shown in FIG. 3, one transducer assembly 200 is disposed within each transducer port 165. Each transducer port 165 has a central axis 166 and extends through spool piece 105 from a radially inner (relative to central axis 110 of FIG. 2) or first end 165a at throughbore 130 to a radially outer (relative to central axis 110) or second end 165b at the outer surface of the spool piece 105. In this embodiment, each transducer port 165 is generally horizontal. In other words, central axis 166 of each transducer port 165 lies in a plane generally parallel to reference plane 111 (FIG. 2). Although a projection of central axis 166 of each transducer port 165 may not necessarily intersect central axis 110 of spool piece 105, for purposes of simplicity, the radial positions of various features and components may be described relative to axis 110, it being generally understood that "radially inner" (relative to central axis 110) refers to positions generally proximal axis 110 and bore 130 and "radially outer" (relative to central axis 110) refers to positions generally distal axis 110 and bore 130.

The inner surface of each transducer port 165 includes an annular shoulder 167 between ends 165a, b and internal threads 169 positioned axially (relative to central axis 166) between shoulder 167 and first end 165a. As will be described in more detail below, shoulder 167 aids in positioning transducer assembly 200 within port 165, and threads 169 engage mating threads on transducer assembly 200, thereby threadingly coupling transducer assembly 200 within port 165 to spool piece 105.

Referring to FIGS. 2 and 3, during use, fluid flows through the pipeline and throughbore 130 of spool piece 105. Transducer assemblies 200 send acoustic signals back and forth across the fluid stream in throughbore 130. In particular, transducer assemblies 200 are positioned such that an acoustic signal traveling from one transducer assembly 200 to the other intersects fluid flowing through meter 100 at an acute angle relative to central axis 110. The electronics package 108 is coupled to the top of the spool piece 105 to provide power to transducer assemblies 200 and receive signals from transducer assemblies 200 via cables 125 extending therebetween. Upon receipt of the signals from transducer assemblies 200, the electronics package 108 processes the signals to determine the fluid flow rate of product passing through bore 130 of flow meter 100.

Referring now to FIG. 3, gas ultrasonic transducer assembly 200, and a port cover assembly 300 coupled thereto, is coaxially disposed within port 165 and extends from throughbore 130 to pocket 175 of boss 135. Thus, transducer assembly 200 has a central or longitudinal axis 205 that is generally coincident with central axis 166 of port 165 when transducer assembly 200 is disposed in port 165. Moving radially outward (relative to axis 110 of FIG. 2) from throughbore 130 of spool piece 105, transducer assembly 200 includes a piezoelectric capsule 210 and a transformer capsule 250 including a terminal block 258. Port cover assembly 300 is coupled to the radially outer end of transducer assembly 200 within port 165. Piezoelectric capsule 210, transformer capsule 250, and port cover assembly 300 are axially coupled end-to-end and coaxially oriented relative to axes 166, 205. Thus, piezoelectric capsule 210, transducer holder 230, transformer capsule 250, and port cover assembly 300 each have a central axis generally coincident with axes 205, 166. For purposes of conciseness, axial positions of various features and components of transducer assembly 200 and port cover assembly 300 are defined herein relative to axes 166, 205, it being understood that each individual component, when assembled into transducer assembly 200 or port cover assembly 300, has a central axis generally coincident with axis 205 and generally coincident with axis 166 when installed in port 165.

Referring now to FIGS. 3-6 and 8, piezoelectric capsule 210 has a radially inner (relative to central axis 110) or first end 210a proximal bore 130, a radially outer (relative to central axis 110) or second end 210b distal bore 130, and includes a body or housing 211, a piezoelectric element 212, and a matching layer 214. In FIG. 3, piezoelectric capsule 210 is shown with matching layer 214 (e.g., after installation of matching layer 214), and in FIGS. 4-7, piezoelectric capsule 210 is shown without matching layer 214 (e.g., prior to inclusion of matching layer 214).

Housing 211 is generally cylindrical and has a central axis 215, a first end 211a coincident with end 210a, and a second end 211b coincident with end 210b. First ends 210a, 211a of piezoelectric capsule 210 and housing 211, respectively, extend axially (relative to axes 166, 205) to bore 130 and are exposed to the fluid flowing within throughbore 130 (FIG. 3). In addition, housing 211 includes an inner chamber 213 proximal first end 211a and an inner chamber 217 proximal second end 211b. In this embodiment, chamber 213 is a counterbore that extends axially (relative to axis 205) from first end 211a of housing 211, and chamber 217 is a counterbore that extends axially (relative to axis 205) from end 211b. Consequently, chamber 213, 217 may also be referred to herein as counterbore 213, 217, respectively. In general, a chamber (e.g., chamber 213) or counterbore (e.g., counterbore 213, 217) may be formed by any suitable process including, without limitation, molding, casting, machining, or combinations thereof. Two generally parallel throughbores 236 extend axially (relative to axes 205, 215) through housing 211 between counterbores 213, 217.

In this embodiment, piezoelectric element 212 is generally cylindrical and is coaxially disposed in counterbore 213 proximal first end 211a and bore 130. Piezoelectric element 212 is a piezoelectric material that produces an electrical potential in response to applied mechanical stress, and produces a mechanical stress and/or strain in response to an applied electric field. More specifically, piezoelectric element 212 produces an electrical potential and associated current in response to an acoustic signal, and produces an acoustic signal in response to an applied electrical potential and associated current. In general, piezoelectric element 212 may include any suitable piezoelectric material including, without limitation, a piezoelectric crystal or ceramic. In this embodiment, piezoelectric element 212 is a piezoelectric crystal.

Referring still to FIGS. 3-6 and 8, two sockets or receptacles 216 are also positioned in counterbore 213 radially inward (relative to axis 110 of FIG. 2) of and aligned with one of throughbores 236. In this embodiment, each socket 216 is a female plug receptacle. Two leads or wires (not shown) electrically couple piezoelectric element 212 to plug sockets 216.

Piezoelectric element 212 and plug sockets 216 are rigidly held in place relative to housing 211 by matching layer 214 that generally fills the remainder of counterbore 213 and surrounds piezoelectric element 212 and female plug sockets 216 (FIG. 3). Matching layer 214, and thus piezoelectric element 212, are coupled to housing 211 within counterbore 213. In general, matching layer 214 may be coupled to housing 211 by any suitable means including, without limitation, interference fit, chemical bond, friction, or combinations thereof. In this embodiment, matching layer 214 is directly connected to the inner cylindrical surface of counterbore 213 of housing 211 by an epoxy bond.

The matching layer (e.g., matching layer 214) may comprise any suitable material(s) including, without limitation, plastic, metal, glass, ceramic, epoxy, powder-filled epoxy, rubber, powder-filled rubber, or combinations thereof. In this embodiment, matching layer 214 is an epoxy that is poured into counterbore 213 in a flowable liquid state and then allowed to solidify and cure. Regardless of its material, the matching layer (e.g., matching layer 214) provides acoustical coupling between the piezoelectric element (e.g., piezoelectric element 212) and fluid flowing through the meter (e.g., fluid flowing in bore 130 of flow meter 100). In accordance with certain embodiments disclosed herein, the acoustic matching layer has an acoustic impedance between that of the piezoelectric element and fluid within the meter. With the acoustic impedance of the matching layer between that of the piezoelectric element and the fluid in the meter, the quality of the ultrasonic signal is improved (e.g., larger amplitude and faster rise time). The acoustic impedance of the matching layer is dependent, at least in part, upon its axial thickness, and thus, control of the axial thickness of the matching layer is critical to the quality of the ultrasonic signal. For example, as best shown in FIG. 3, matching layer 214 has an axial thickness $L_{214}$ measured axially (relative to axis 205) between the fluid in bore 130 and piezoelectric element 212. Axial thickness $L_{214}$ is preferably calculated and controlled to optimize the quality of the ultrasonic signal. In particular, the axial thickness $L_{214}$ of matching layer 214 is preferably any ¼ increment of the acoustic wavelength produced by piezoelectric element 212.

Figure 4:
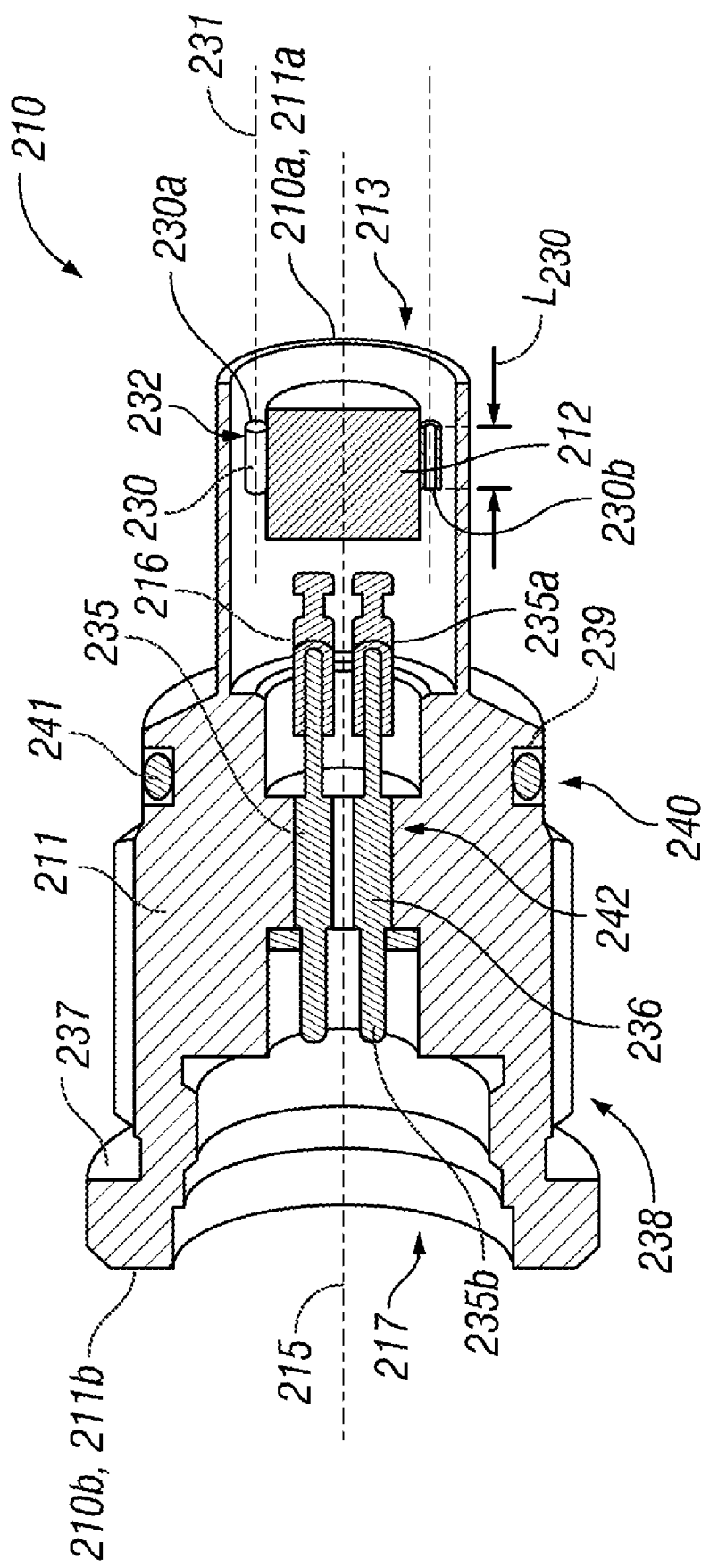
FIG. 4 is an enlarged partial cross-sectional side view of the piezoelectric capsule of the transducer assembly of FIG. 3.
Figure 7:
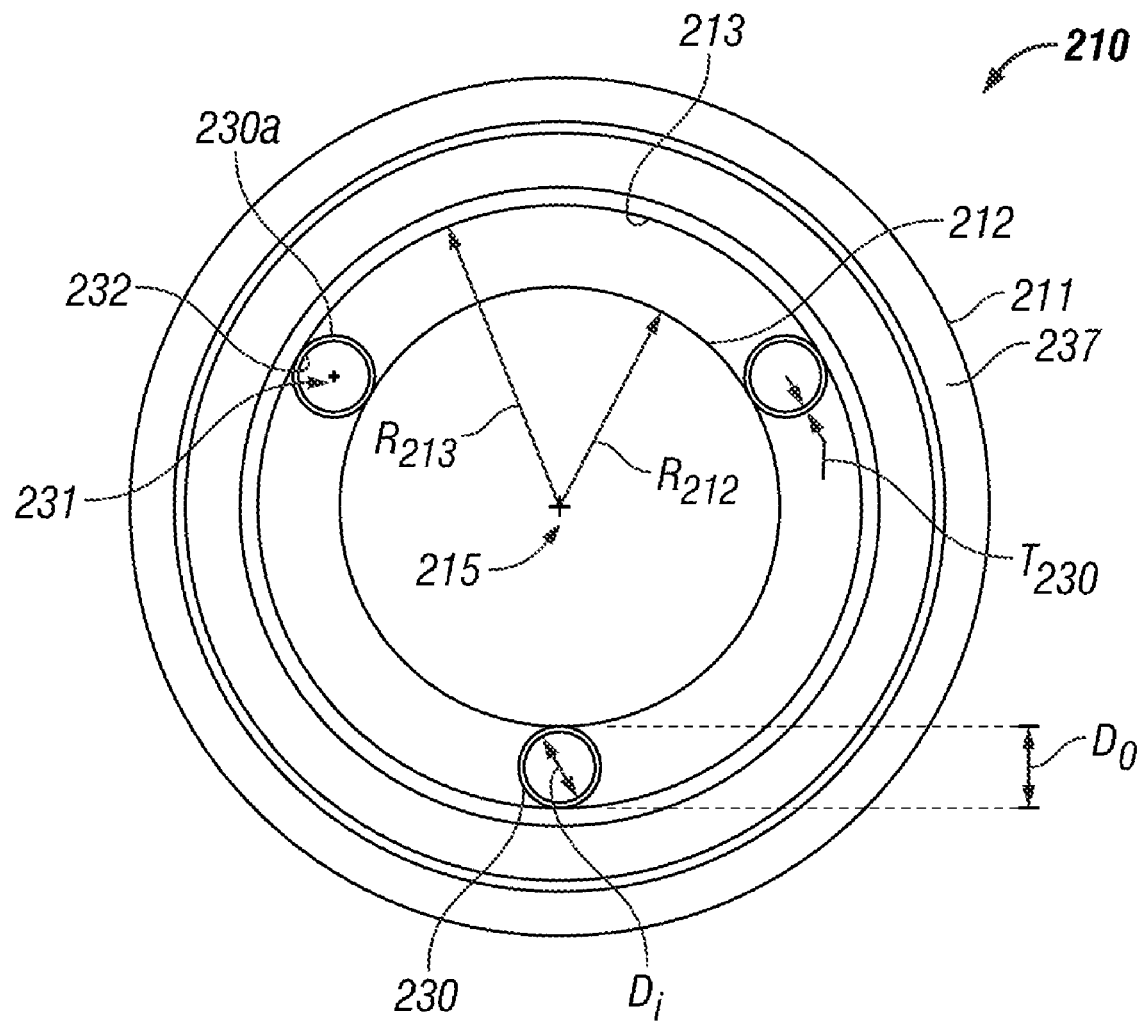
FIG. 7 is a schematic end view of the piezoelectric capsule of the transducer assembly of FIG. 3.
Figure 8:
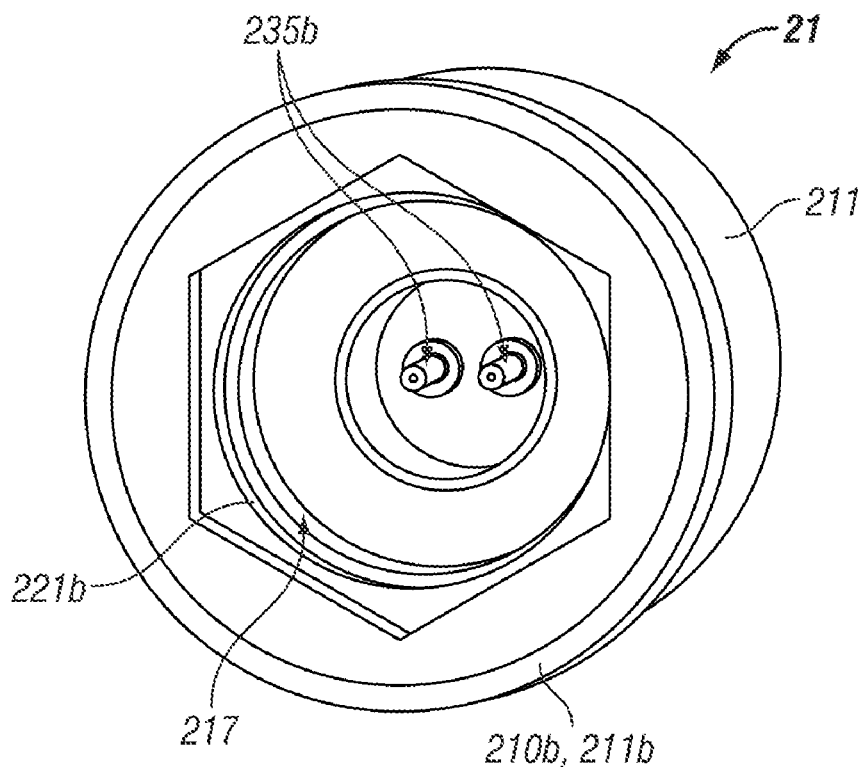
FIG. 8 is a perspective end view of the piezoelectric capsule of the transducer assembly of FIG. 3.

Referring now to FIGS. 4-7, as previously described, piezoelectric element 212 is coaxially disposed in counterbore 213 proximal first end 211a and bore 130. In addition, a plurality of circumferentially spaced spacers 230 are disposed in counterbore 213 about piezoelectric element 212. In particular, each spacer 230 is radially positioned (relative to axes 205, 215) within counterbore 213 between piezoelectric element 212 and housing 211. Further, in this embodiment, each spacer 230 is substantially identical. Namely, in this embodiment, each spacer 230 is an elongate thin-walled tubular having a central axis 231, ends 230a, b, and a central throughbore 232 extending axially (relative to axis 231) between ends 230a, b. As best shown in FIGS. 4 and 7, each spacer 230 has an axial length $L_{230}$ measured axially (relative to axis 231) between ends 230a, b, an inner diameter $D_i$, an outer diameter $D_o$, and a radial thickness $T_{230}$ equal to half the difference between outer diameter $D_o$ and inner diameter D. Thickness $T_{230}$ is significantly less than inner diameter $D_i$ and outer diameter $D_o$, and thus, spacers 230 may generally be described as "thin-walled." Although spacers 230 are generally cylindrical tubular in this embodiment, in general, one or more of the spacers (e.g., spacers 230) may have any suitable geometry including, without limitation, rectangular, trapezoidal, triangular, etc. As best shown in FIGS. 4 and 7, spacers 230 are axially oriented (i.e., parallel to central axis 215) and positioned generally parallel to each other.

Figure 5:
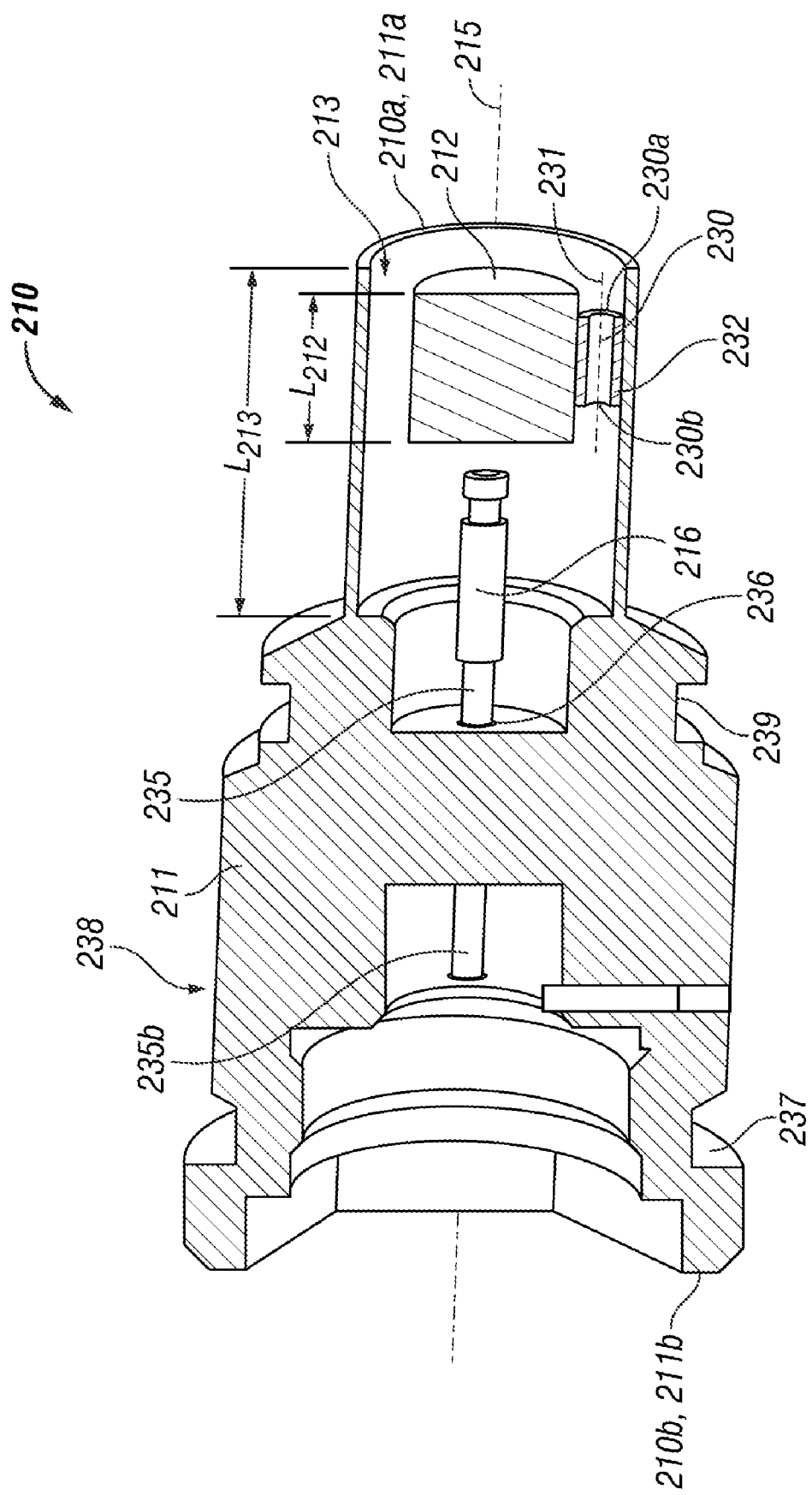
FIG. 5 is an enlarged partial cross-sectional top view of the piezoelectric capsule of the transducer assembly of FIG. 3.
Figure 6:
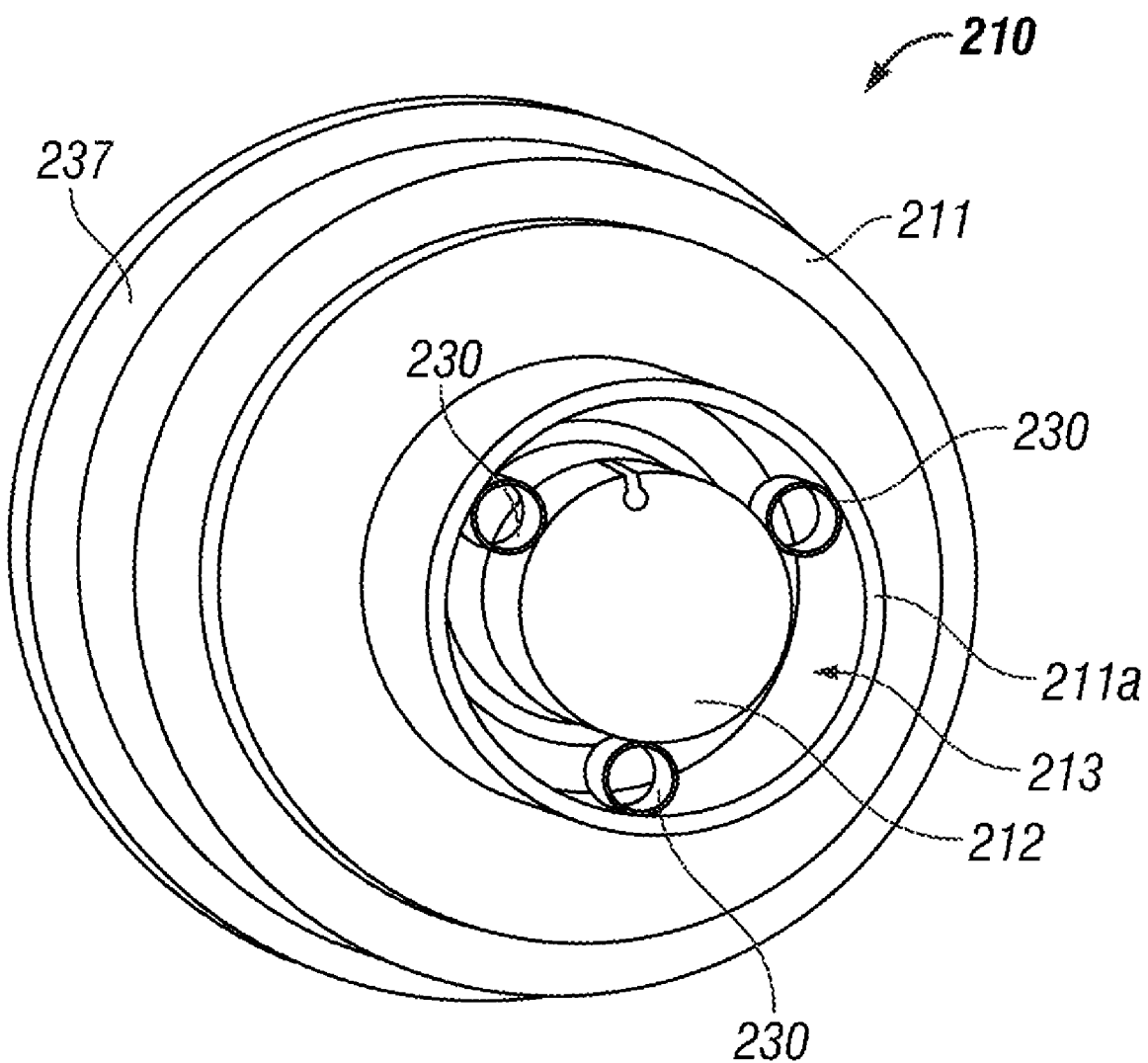
FIG. 6 is a perspective end view of the piezoelectric capsule of the transducer assembly of FIG. 3.

As best shown in FIG. 5, piezoelectric element 212 has an axial length $L_{212}$ (measured parallel to axis 215), and counterbore 213 has an axial length $L_{213}$ (measured parallel to axis 215) that is greater than length $L_{212}$. The axial length $L_{230}$ of each spacer 230 is preferably at least half the axial length $L_{212}$ of piezoelectric element 212 in order to reduce and/or prevent the crystal from rotating or pivoting about one or more spacers 230 during assembly. In this embodiment, axial length $L_{230}$ of each spacer 230 is about half the axial length $L_{212}$ of piezoelectric element 212. Further, as best shown in FIG. 7, piezoelectric element 212 has a substantially uniform outer radius $R_{212}$, and housing 211 has a substantially uniform inner radius $R_{213}$ within counterbore 213 that is greater than radius $R_{212}$. Outer diameter $D_o$ of each spacer 230 is substantially the same or slightly greater than the difference between radius $R_{213}$ and radius $R_{212}$. Thus, spacers 230 are sized to form an interference fit between piezoelectric element 212 and housing 211. In embodiments where outer diameter $D_o$ of each spacer 230 is slightly greater than the difference between radius $R_{213}$ and radius $R_{212}$, spacers 230 may be radially squeezed or compressed between piezoelectric element 212 and housing 211, and/or piezoelectric element 212 may be radially squeezed or compressed between spacers 230. In such embodiments, spacers 230 may comprise resilient material(s) that function similar to compressed springs to generate radial forces that bias piezoelectric element 212 into the preferred radial position within counterbore 213.

Referring to FIGS. 4-7, during manufacture of piezoelectric capsule 210, and prior to incorporation of matching layer 214, spacers 230 maintain the axial and radial position of piezoelectric element 212 within counterbore 213 (relative to axis 215). In particular, to assembly piezoelectric capsule 210, piezoelectric element 212 is axially inserted into counterbore 213. As previously described, length $L_{212}$ of piezoelectric element 212 is less than length $L_{213}$ of counterbore 213, and outer radius $R_{212}$ of piezoelectric element 212 is less than inner radius $R_{213}$ of housing 211 within counterbore 213. Thus, prior to the insertion of spacers 230 and implementation of matching layer 214, piezoelectric element 212 is free to move radially and axially (relative to axis 215) within counterbore 213 relative to housing 211.

Next, spacers 230 are axially inserted into counterbore 213 between piezoelectric element 212 and housing 211. To achieve and maintain the coaxial arrangement of piezoelectric element 212 within counterbore 213, preferably at least three spacers 230 are radially disposed between piezoelectric element 212 and housing 211, with each pair of circumferentially adjacent spacers 230 and angularly spaced less than 180° apart about axis 215. In order to subject piezoelectric element 212 to balanced radial forces, the spacers (e.g., spacers 230) are preferably uniformly circumferentially spaced about the piezoelectric element (e.g., piezoelectric element 212). In this embodiment, three spacers 230 uniformly angularly spaced about 120° apart are provided. However, in other embodiments more than three spacers (e.g., spacers 230) may be employed, and further, the angular spacing of the spacers may be varied. For example, in one embodiment, four spacers uniformly angularly spaced about 90° apart may be disposed between the piezoelectric element (e.g., piezoelectric element 212) and the housing (e.g., housing 211).

Referring still to FIGS. 4-7, as previously discussed, spacers 230 are sized to form an interference fit between piezoelectric element 212 and housing 211. Due to the sizing and configuration of spacers 230, counterbore 230, and piezoelectric element 212, the radially outer surface of each spacer 230 engages the radially outer surface of piezoelectric element 212 and the radially inner surface of housing 211 within counterbore 213. Thus, during axial insertion of spacers 230 between piezoelectric element 212 and housing 211, spacers 230 slidingly engage piezoelectric element 212 and housing 211. The static friction arising from the engagement of spacers 230 and housing 211, and spacers 230 and piezoelectric element 212, restrict the axial movement of spacers 230 and piezoelectric element 212 relative to housing 211 and counterbore 213. Further, the radial engagement of spacers 230 with piezoelectric element 212 and housing 211 restrict the radial movement (relative to axis 215) of piezoelectric element 212 within counterbore 213 relative to housing 211. Following the insertion and circumferential spacing of spacers 230, piezoelectric element 212 may be urged axially (relative to axis 215) to adjust the axial position of piezoelectric element 212 within counterbore 213; piezoelectric element 212 will begin to move axially within counterbore 213 (relative to axis 215) once the applied axial force is sufficient to overcome the static friction at the interface of piezoelectric element 212 and spacers 230.

Once the desired axial position of piezoelectric element 212 within counterbore 213 is achieved, matching layer 213 is employed to fill the remainder of counterbore 213 and encase piezoelectric element 212. As previously described, in this embodiment, matching layer 214 is an epoxy. To fill counterbore 213 with epoxy matching layer 214, housing 211 is oriented vertically with end 211a above end 211b, and then matching layer 214 is poured into counterbore 213 via end 211a in a liquid form. The liquid epoxy matching layer 214 is free to flow through the voids radially disposed between piezoelectric element 212 and housing 211 and circumferentially disposed between spacers 230, and through throughbores 232 of spacers 230, thereby completely filling the remainder of counterbore 213. Once counterbore 213 is completely filled, the liquid epoxy matching layer 214 is allowed to harden and cure. Following the curing process, the end of the hardened epoxy matching layer 214 proximal housing end 211a may be machined flat to achieve the desired axial length of matching layer 214. During the filling of counterbore 213 with liquid epoxy matching layer 214 and the curing of liquid epoxy matching layer 214, spacers 230 (and associated interference fit between piezoelectric element 212 and housing 211) maintain the radial and axial position of piezoelectric element 212 within counterbore 213.

In general, the spacers (e.g., spacers 230) may comprise any suitable material(s) including, without limitation, metal (e.g., aluminum), metal alloys (e.g., steel), non-metals (e.g., plastic, composite, rubber, etc.), or combinations thereof. The spacers preferably comprise a relatively rigid, resilient material that may be slightly squeezed or compressed while maintaining its integrity such as stainless steel (e.g., 316SS).

Referring now to FIGS. 3-6 and 8, an electrical coupling 235 is coaxially disposed in each throughbore 236. Each electrical coupling 235 has ends 235 a, b connected to piezoelectric capsule 210 and transformer capsule 250, respectively. Couplings 235 electrically couple piezoelectric capsule 210 and transformer capsule 250, and allow communication of data relating to the fluid flowing in bore 130 from piezoelectric capsule 210 to transformer capsule 250. In this embodiment, ends 235a, b of couplings 235 are each male connectors that mate and engage with corresponding female plug sockets 216 in piezoelectric capsule 210 and two female plug sockets in transformer capsule 250, respectively.

An annular seal 242 is provided between each coupling 235 and housing 211, thereby restricting and/or preventing the axial flow of fluids (relative to axis 205) between couplings 235 and housing 211. Seals 242 formed between couplings 235 and housing 211 are preferably sufficient to withstand the expected fluid pressures in bore 130, which are typically greater than ambient. In this embodiment, each seal 242 is a glass seal.

Referring now to FIGS. 3-5, the radially outer surface of housing 211 (relative to axis 205) includes an annular shoulder 237 proximal second end 210b, external threads 238 positioned between shoulder 237 and inner end 210a, and an annular recess or groove 239 axially positioned (relative to axis 205) between external threads 238 and inner end 210a. An annular seal 241 is disposed in groove 239. Together, groove 239 and seal 241 disposed therein define a seal assembly 240 positioned radially (relative to axis 205) between piezoelectric capsule 210 and spool piece 105. Seal assembly 240 forms an annular seal between piezoelectric capsule 210 and spool piece 105, thereby restricting and/or preventing the flow of fluid (e.g., fluid flowing in bore 430) between piezoelectric capsule 210 and spool piece 105. In this embodiment, annular seal 241 is an elastomeric O-ring seal that is radially compressed between spool piece 105 and piezoelectric capsule 210 upon assembly.

Seal assembly 240 restricts and/or prevents the flow of fluid (e.g., fluid flowing in bore 130) between piezoelectric capsule 210 and spool piece 105, and annular seals 242 restrict and/or prevent the axial flow of fluids (relative to axis 205) between each coupling 235 and housing 211. Seal assembly 240 and seals 242 work together to restrict and/or prevent potentially hazardous, contaminating, or corrosive fluids in bore 130 from escaping bore 130 via port 165. Seal assembly 240 and seals 242 also function to maintain the pressure differential between ambient conditions external spool piece 105 and the pressurized fluid flowing in bore 130. Thus, although piezoelectric capsule 210 is exposed to the fluid and pressures within bore 130, transformer capsule 250, port cover assembly 300, and cable 125 are isolated from the fluids (and associated pressures) within bore 130.

Piezoelectric capsule 210 is threadingly coupled to spool piece 105 via mating threads 169, 238, and annular shoulder 237 of housing 211 engages annular shoulder 167 of port 165. During assembly, piezoelectric capsule 210 is threaded and axially advanced into port 165 until shoulders 167, 237 engage, thereby preventing continued axial advancement of piezoelectric capsule 210 (and transducer assembly 200) into port 165. Thus, shoulder 167 in port 165 defines the axial position of piezoelectric capsule 210 (and transducer assembly 200) within port 165.

Figure 9:
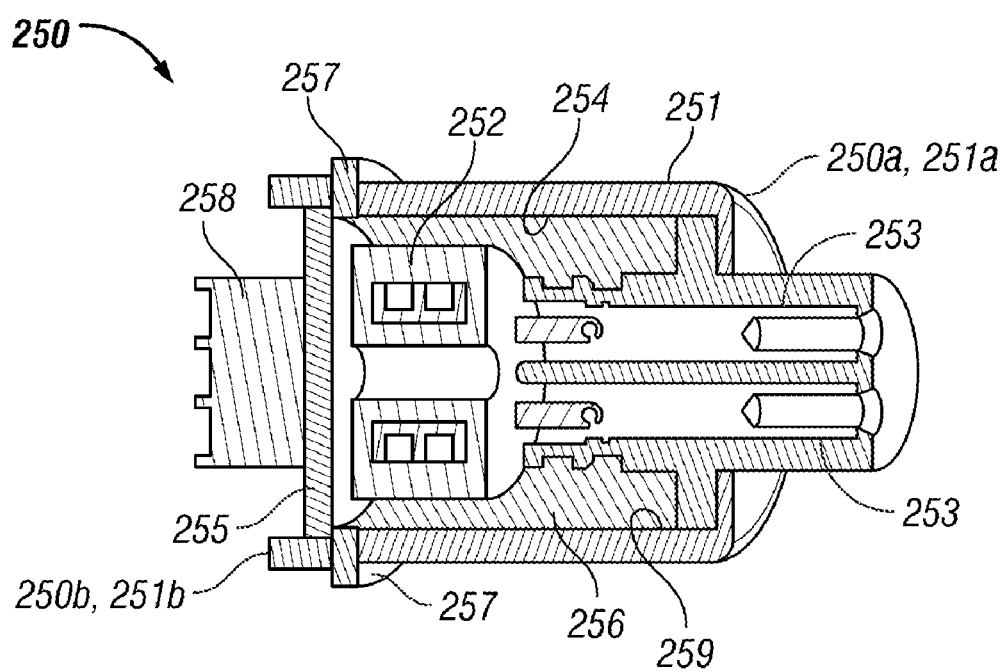
FIG. 9 is an enlarged cross-sectional side view of the transformer capsule of FIG. 3.

Referring now to FIGS. 3 and 9, transformer capsule 250 has a radially inner (relative to axis 205) or first end 250a, a radially outer (relative to axis 205) or second end 250b, and includes a body or housing 251, a circuit board 255, terminal block 258 previously described coupled to circuit board 255, a transformer 252, and a pair of female plug sockets or receptacles 253. Housing 251 extends axially (relative to axis 205) between ends 250a, b, and thus, may also be described as having first and second ends 251a, b coincident with ends 250a, b, respectively. Housing 251 includes an inner chamber 259 defined by a throughbore 254 extending axially (relative to axis 205) between ends 251a, b and two circumferentially spaced (relative to axis 205) radially outward extending pins 257 proximate end 251b, which enable coupling of port cover assembly 300 to transformer capsule 250.

As best shown in FIG. 9, plug sockets or receptacles 253, circuit board 255, and transformer 252 are disposed in throughbore 254. Terminal block 258 is disposed proximate second end 250b of transformer capsule 250 and is coupled to housing 251 proximate second end 251b. In particular, terminal block 258 is mounted to and extends axially (relative to axis 205) from circuit board 255. Circuit board 255, transformer 252, and plug sockets 252 are electrically coupled via two lead wires (not shown). In this embodiment, each plug socket 253 is a female plug.

Circuit board 255, transformer 252, and female plug sockets 253 are rigidly held in place relative to housing 251 within throughbore 254 by a fill material 256 that fills the remainder of throughbore 254. In general, the fill material (e.g., fill material 256) may include any suitable material such as, but not limited to, plastic, epoxy, and glass powder. The fill material is preferably a non-conductor that fills all open spaces and air pockets within the throughbore (e.g., throughbore 254), and secures or bonds the assembly in place. In this embodiment, filler 256 is a rigid epoxy similar to matching layer 214.

As best shown in FIG. 3, electrical couplings 235 are disposed in throughbores 236 of housing 211 and extend between piezoelectric capsule 210 and transformer capsule 250. Ends 235a, b of each coax couplings 235 engage and mate with female plug sockets 216, 253, respectively, thereby electrically coupling piezoelectric capsule 210 and transformer capsule 250. In particular, first end 250a of transformer capsule 250, with cable 125 and port cover assembly 900 coupled thereto, is inserted into counterbore 217 of piezoelectric capsule 210 to shoulder transformer capsule 250 against piezoelectric capsule 210 with ends 235b of male connectors 235 received within female plug sockets 253. Thus, piezoelectric capsule 210 and transformer capsule 250 are axially spaced apart (relative to axis 205) by electrical couplings 235.

Referring still to FIG. 3, port cover assembly 300 enables coupling of cable 125 to terminal block 258 such that there is negligible tension at this coupling and enables cable 125 to be easily covered, for example, by cover 120. In addition, port cover assembly 900 also prevents and/or restricts ingress of fluid, such as rainwater, melted snow, or atmospheric condensate, through end 165b of transducer port 165. Thus, port cover assembly 300 forms a seal across end 165b of transducer port 165. Port cover assembly 300 includes a tubular member 309, a sealed cover cap 304, and a spring 306 disposed axially therebetween.

Referring still to FIG. 3, the order in which the various components of transducer assembly 300 and port cover assembly 300 are assembled may be varied. However, transducer assembly 200 and port cover assembly 300 are preferably assembled prior to insertion into port 165, and further, a first subassembly including transformer capsule 250 and port cover assembly 300 is preferably assembled prior to coupling transformer capsule 250 to piezoelectric capsule 210.

While preferred embodiments have been shown and described, modifications thereof can be made by one skilled in the art without departing from the scope or teachings herein. The embodiments described herein are exemplary only and are not limiting. Many variations and modifications of the systems, apparatus, and processes described herein are possible and are within the scope of the invention. For example, the relative dimensions of various parts, the materials from which the various parts are made, and other parameters can be varied. Accordingly, the scope of protection is not limited to the embodiments described herein, but is only limited by the claims that follow, the scope of which shall include all equivalents of the subject matter of the claims.

What is claimed is:

1. A transducer assembly comprising:
a piezoelectric capsule including:
   a housing having a central axis, a first end, a second end opposite the first end, and a first inner chamber extending axially from the first end;
   a piezoelectric element disposed in the first inner chamber; and
   a plurality of spacers disposed in the first inner chamber, wherein each spacer is radially disposed between the piezoelectric element and the housing, and wherein the spacers are configured to maintain radial position of the piezoelectric element during manufacture of the piezoelectric capsule.

2. The transducer assembly of claim 1, wherein the piezoelectric element is coaxially disposed in the first inner chamber.

3. The transducer assembly of claim 2, wherein each spacer is elongate and has a central axis generally parallel to the central axis of the housing.

4. The transducer assembly of claim 2, further comprising a matching layer disposed in the first inner chamber, wherein the matching layer surrounds the spacers and the piezoelectric element.

5. The transducer assembly of claim 1, wherein each spacer engages the housing and the piezoelectric element.

6. The transducer assembly of claim 5, wherein each spacer is radially disposed between the piezoelectric element and the housing by an interference fit.

7. The transducer assembly of claim 5, wherein each spacer is radially compressed between the piezoelectric element and the housing.

8. The transducer assembly of claim 7, wherein each spacer is a cylindrical tubular, and has a central axis, an outer diameter, and an axial length measured parallel to the central axis of the spacer.

9. The transducer assembly of claim 8, wherein the piezoelectric element has an axial length measured parallel to the central axis of the housing, and wherein the axial length of each spacer is less than the axial length of the piezoelectric element.

10. The transducer assembly of claim 5, wherein the plurality of spacers comprises at least three spacers that are uniformly circumferentially spaced about the piezoelectric element.

11. The transducer assembly of claim 10, further comprising a transformer capsule coupled to the piezoelectric capsule, wherein the transformer capsule includes:
   a transformer housing having a central axis, a first end, a second end, and an inner chamber; and
   a transformer disposed in the inner chamber of the transformer housing, wherein the transformer is electrically coupled to the piezoelectric element.

12. The transducer assembly of claim 11, wherein the second end of the piezoelectric capsule includes a second inner chamber that at least partially receives the first end of the transformer capsule.

13. An ultrasonic flow meter for measuring the flow of a fluid through a pipeline, comprising:
   a spool piece including a throughbore and a transducer port extending from the outer surface of the spool piece to the throughbore;
   a transducer assembly disposed in the transducer port, wherein the transducer assembly has a central axis and comprises:
      a piezoelectric capsule including:
         a housing having a first end, a second end, and an inner chamber proximal the first end;
         a piezoelectric element disposed in the inner chamber; and
         a plurality of spacers disposed within the inner chamber, wherein each spacer is radially disposed between the piezoelectric element and the housing, and wherein the spacers are configured to maintain radial position of the piezoelectric element during manufacture of the transducer assembly;
      a transformer capsule including a transformer, wherein the transformer capsule is coupled to the piezoelectric capsule.

14. The ultrasonic flow meter of claim 13, further comprising a matching layer disposed in the inner chamber between the piezoelectric element and the first end of the housing.

15. The ultrasonic flow meter of claim 14, wherein each spacer engages the housing and the piezoelectric element.

16. The ultrasonic flow meter of claim 15, wherein each spacer is radially compressed between the piezoelectric element and the housing.

17. The ultrasonic flow meter of claim 15, wherein the matching layer is radially disposed between the piezoelectric element and the housing, and circumferentially disposed between each pair of circumferentially adjacent spacers.

18. The ultrasonic flow meter of claim 15, wherein the plurality of spacers comprises at least three spacers that are uniformly circumferentially spaced about the piezoelectric element.

19. A method for manufacturing an ultrasonic flow meter comprising the steps of:
 (a) providing a piezoelectric housing having a central axis, a first end, a second end opposite the first end, and a first counterbore extending axially from the first end;
 (b) inserting a piezoelectric element into the first counterbore;
 (c) inserting a plurality of spacers into the first counterbore;
 (d) positioning each of the spacers radially between the piezoelectric element and the housing;
 (e) coaxially positioning the piezoelectric element within the first counterbore;
 (f) maintaining the coaxial position of the piezoelectric element in the first counterbore with the spacers; and
 (g) filling the first counterbore with a matching layer while maintaining the coaxial position of the piezoelectric element in step (f).

20. The method of claim 19, further comprising engaging the outer surface of the piezoelectric element and the inner surface of the housing within the first counterbore with each spacer.

21. The method of claim 20, wherein step (f) further comprises maintaining the position of each spacer between the piezoelectric element and the housing with an interference fit.

22. The method of claim 20, wherein step (d) further comprises circumferentially spacing the spacers about the piezoelectric element.

23. The method of claim 22, wherein the plurality of spacers includes at least three spacers that are circumferentially spaced less than 180° apart about the piezoelectric element.

24. The method of claim 23, wherein the plurality of spacers are uniformly circumferentially spaced about the piezoelectric element.

25. The method of claim 22, wherein step (d) further comprises positioning the piezoelectric element at a predetermined axial distance from the first end of the housing.

26. The method of claim 19, wherein the matching layer is an epoxy, and wherein step (g) comprises:
 pouring the epoxy into the first counterbore in liquid form; and
 allowing the epoxy to harden and cure.

27. The method of claim 26, further comprising the step of machining a portion of the epoxy proximal the first end of the housing to a substantially planar surface after step (g).

28. The method of claim 19, further comprising the step of coupling a transformer capsule to the piezoelectric housing, wherein the transformer capsule includes a transformer housing and a transformer disposed within the transformer housing.

* * * * *